United States Patent
Yeong et al.

(10) Patent No.: US 11,563,079 B2
(45) Date of Patent: Jan. 24, 2023

(54) METAL INSULATOR METAL (MIM) STRUCTURE AND MANUFACTURING METHOD THEREOF

(71) Applicant: TAIWAN SEMICONDUCTOR MANUFACTURING COMPANY LTD., Hsinchu (TW)

(72) Inventors: Sai-Hooi Yeong, Hsinchu County (TW); Chih-Yu Chang, New Taipei (TW); Chun-Yen Peng, Hsinchu (TW); Chi On Chui, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 482 days.

(21) Appl. No.: 16/737,569

(22) Filed: Jan. 8, 2020

(65) Prior Publication Data
US 2021/0210594 A1    Jul. 8, 2021

(51) Int. Cl.
  *H01G 4/20* (2006.01)
  *H01L 49/02* (2006.01)
  *H01G 13/00* (2013.01)
  *H01G 4/08* (2006.01)

(52) U.S. Cl.
  CPC ............ *H01L 28/60* (2013.01); *H01G 4/08* (2013.01); *H01G 4/20* (2013.01); *H01G 13/00* (2013.01)

(58) Field of Classification Search
  None
  See application file for complete search history.

(56) References Cited

U.S. PATENT DOCUMENTS

| | | | | |
|---|---|---|---|---|
| 5,524,092 A | * | 6/1996 | Park | H01L 28/55 257/295 |
| 5,622,893 A | * | 4/1997 | Summerfelt | H01L 28/60 438/785 |
| 7,410,812 B2 | * | 8/2008 | Yamaguchi | C23C 16/308 257/E21.267 |
| 7,602,599 B1 | * | 10/2009 | Hsu | H01G 4/30 361/306.3 |
| 7,906,832 B2 | * | 3/2011 | Kageyama | H01L 27/0805 257/532 |
| 10,658,455 B2 | * | 5/2020 | Hsu | H01L 28/91 |
| 2004/0157391 A1 | * | 8/2004 | Park | H01L 28/56 438/250 |
| 2005/0212082 A1 | * | 9/2005 | Takeda | H01L 28/40 257/E21.582 |

(Continued)

OTHER PUBLICATIONS

U.S. Appl. No. 16/515,915, filed Jul. 18, 2019.

*Primary Examiner* — Dion R. Ferguson
(74) *Attorney, Agent, or Firm* — WPAT Law; Anthony King

(57) ABSTRACT

A MIM structure and manufacturing method thereof are provided. The MIM structure includes a substrate having a first surface and a metallization structure over the substrate. The metallization structure includes a bottom electrode layer, a dielectric layer on the bottom electrode layer, a ferroelectric layer on the dielectric layer, a top electrode layer on the ferroelectric layer, a first contact electrically coupled to the top electrode layer, and a second contact penetrating the dielectric layer and the ferroelectric layer, electrically coupled to the bottom electrode layer.

20 Claims, 15 Drawing Sheets

(56) References Cited

U.S. PATENT DOCUMENTS

| | | | |
|---|---|---|---|
| 2006/0183280 A1* | 8/2006 | Lee | H01L 21/76816 |
| | | | 257/E21.011 |
| 2009/0316332 A1* | 12/2009 | Okubo | H01L 27/016 |
| | | | 257/532 |
| 2010/0238603 A1* | 9/2010 | Chung | H01L 28/90 |
| | | | 361/301.4 |
| 2010/0279484 A1* | 11/2010 | Wang | H01L 28/75 |
| | | | 29/25.41 |
| 2014/0313637 A1* | 10/2014 | Shukh | H01G 4/008 |
| | | | 361/523 |
| 2015/0325635 A1* | 11/2015 | Zang | H01L 23/53228 |
| | | | 257/532 |
| 2017/0207299 A1* | 7/2017 | Lin | H01L 28/56 |
| 2018/0190761 A1* | 7/2018 | Chiang | H01L 28/90 |
| 2018/0308635 A1* | 10/2018 | Chen | H01G 4/232 |
| 2020/0027946 A1* | 1/2020 | Liu | H01L 23/5223 |
| 2020/0044091 A1* | 2/2020 | Tsai | H01L 29/78 |
| 2020/0243266 A1* | 7/2020 | Totsuka | H01G 4/1272 |
| 2020/0350324 A1* | 11/2020 | Hoffmann | H01L 28/60 |
| 2021/0066448 A1* | 3/2021 | Chang | H01L 28/60 |
| 2021/0210594 A1* | 7/2021 | Yeong | H01G 4/08 |

* cited by examiner

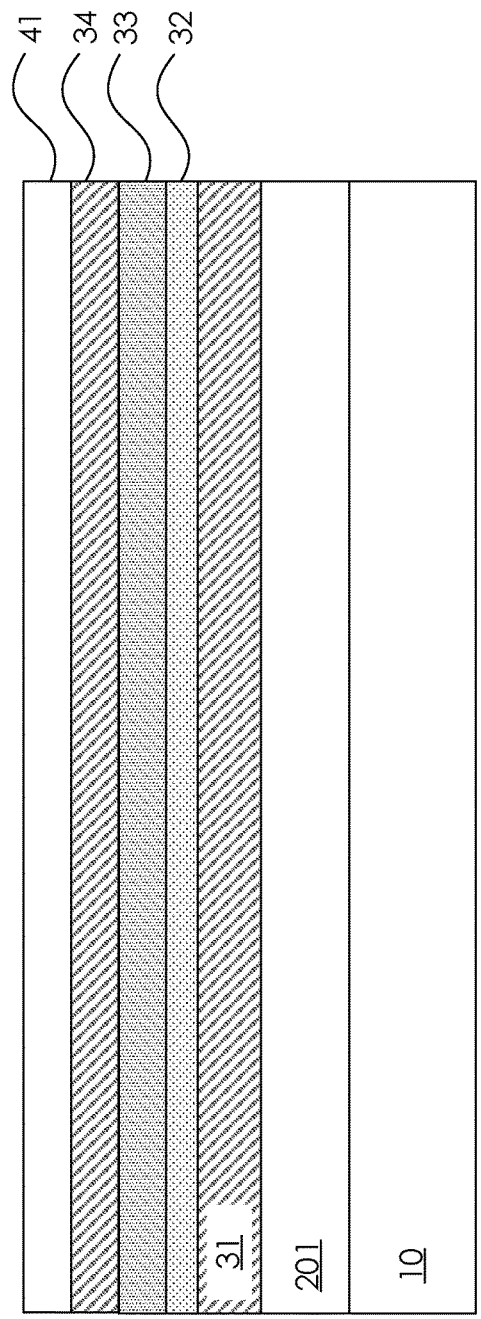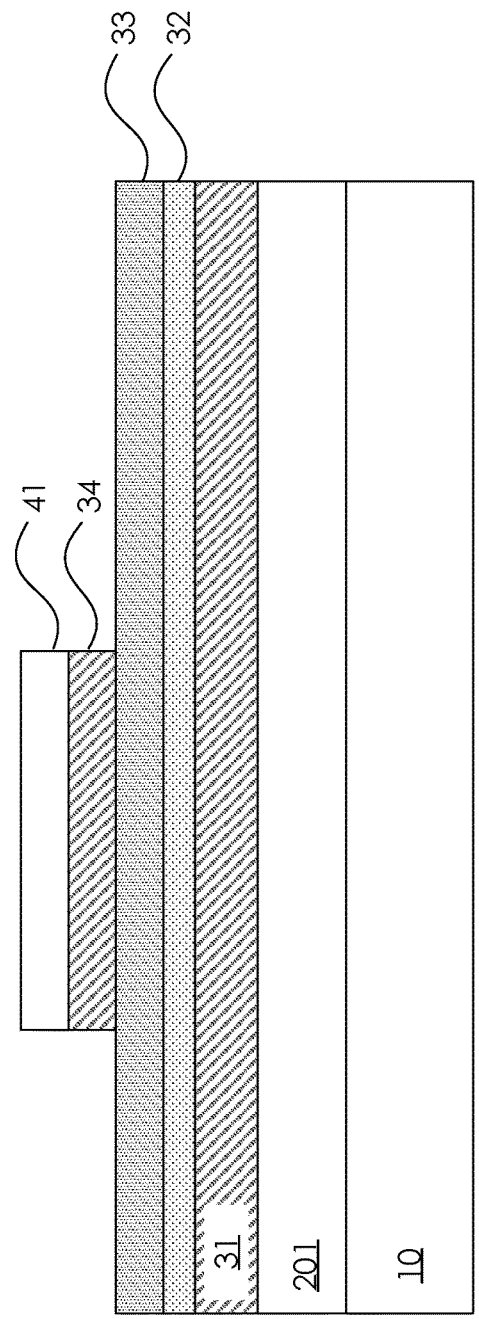

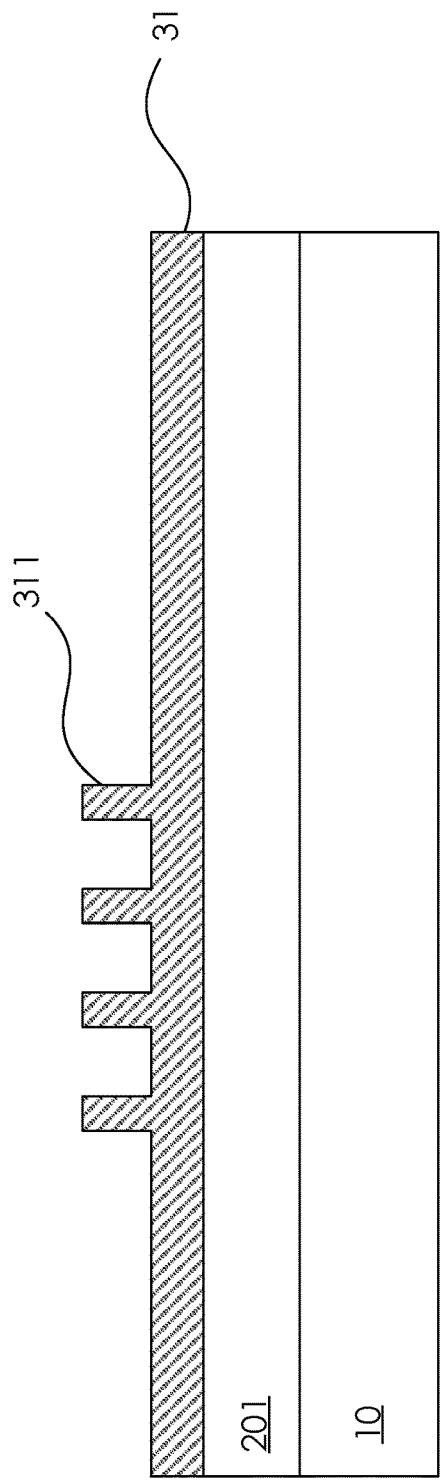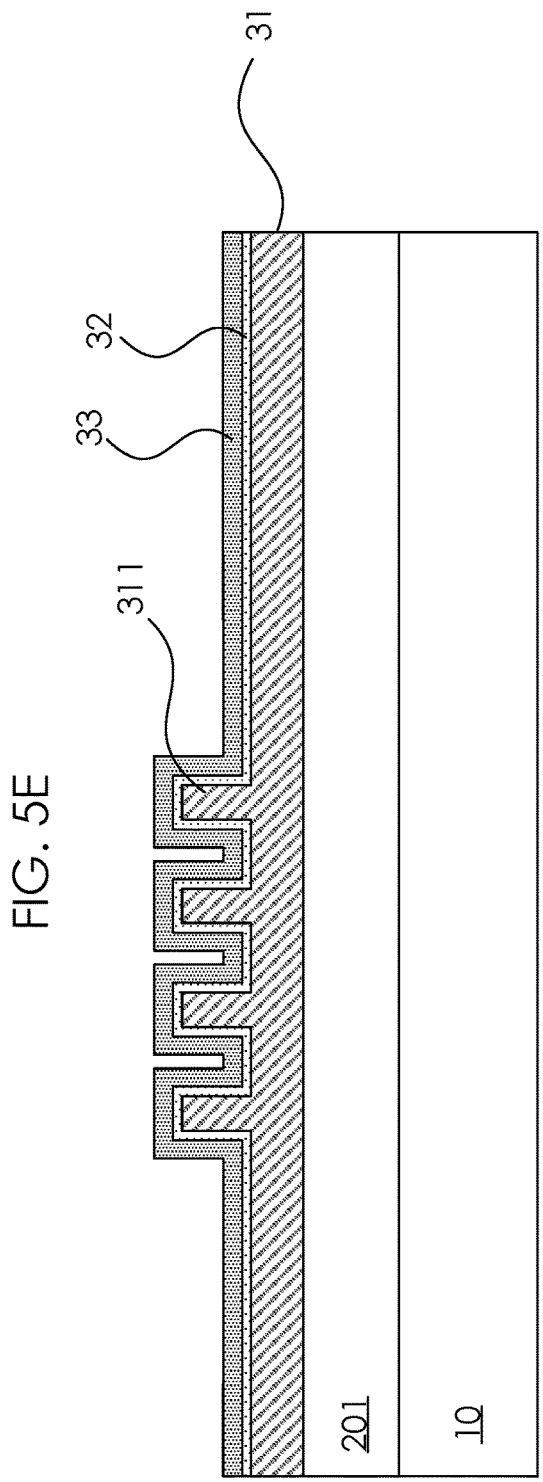

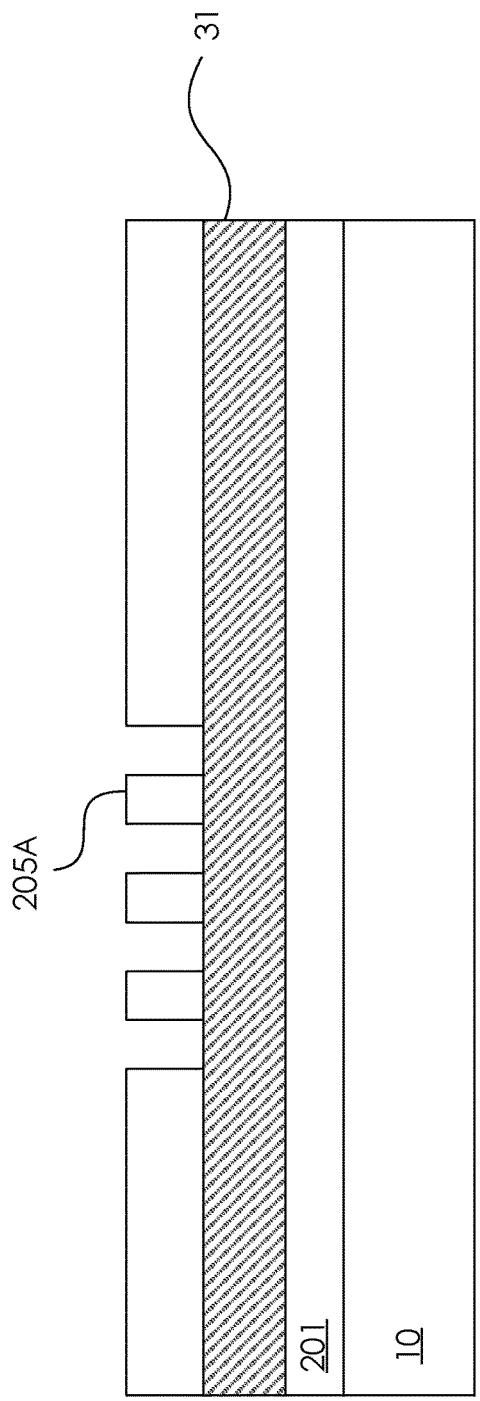
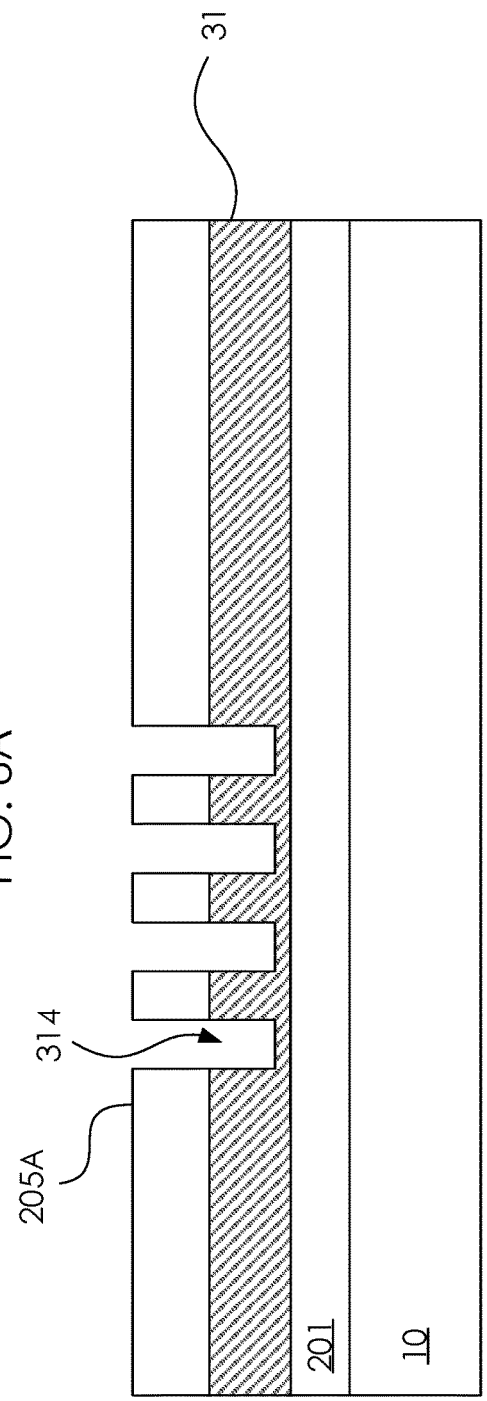

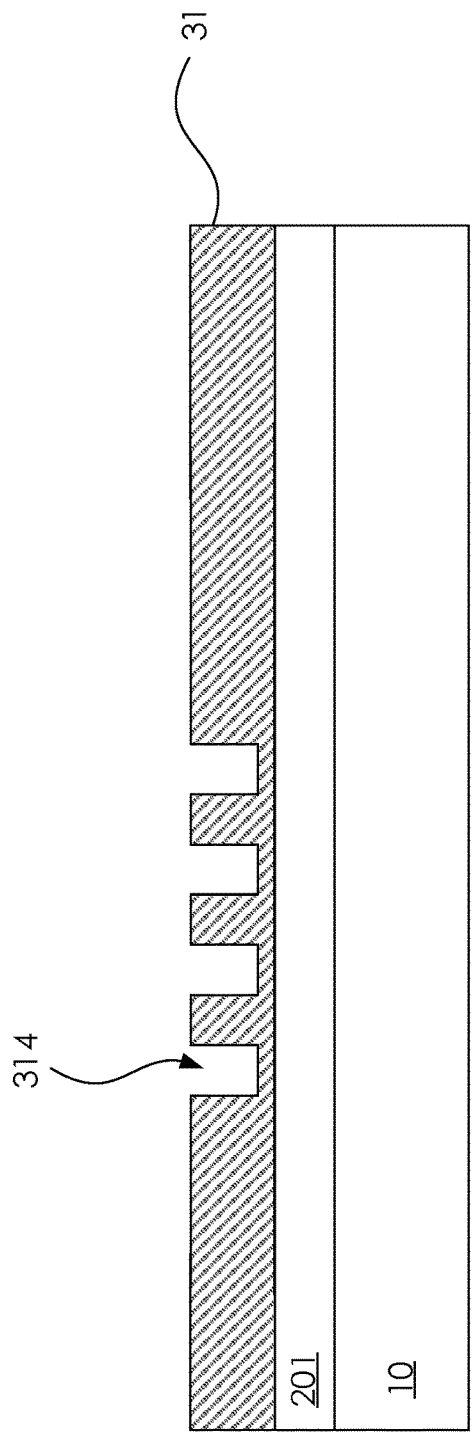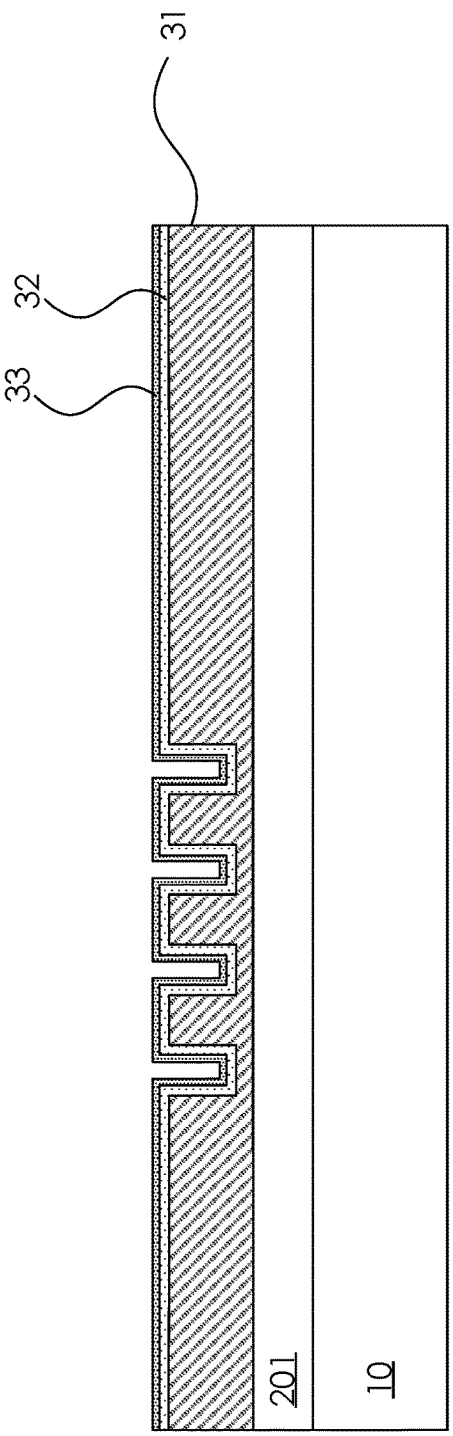

METAL INSULATOR METAL (MIM) STRUCTURE AND MANUFACTURING METHOD THEREOF

FIELD

The present disclosure is related to a metal insulator metal (MIM) structure and manufacturing method thereof, more particularly, to a MIM structure including a ferroelectric layers stack on a dielectric layer to boost the capacitance of the MIM structure by polarization coupling effect.

BACKGROUND

The semiconductor integrated circuit (IC) industry has experienced exponential growth. Technological advances in IC materials and design have produced generations of ICs where each generation has smaller and more complex circuits than the previous generation. In the course of the IC evolution, functional density (e.g., the number of interconnected devices per chip area) has generally increased while geometry size (e.g., the smallest component or line that can be created using a fabrication process) has decreased.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIGS. 4A to 4I illustrate cross-sectional views at various operations of manufacturing a semiconductor structure according to some embodiments of the present disclosure.

FIGS. 5A to 5F illustrate cross-sectional views at various operations of manufacturing a semiconductor structure according to some embodiments of the present disclosure.

FIGS. 6A to 6D illustrate cross-sectional views at various operations of manufacturing a semiconductor structure according to some embodiments of the present disclosure.

DETAILED DESCRIPTION

Figure 1A:
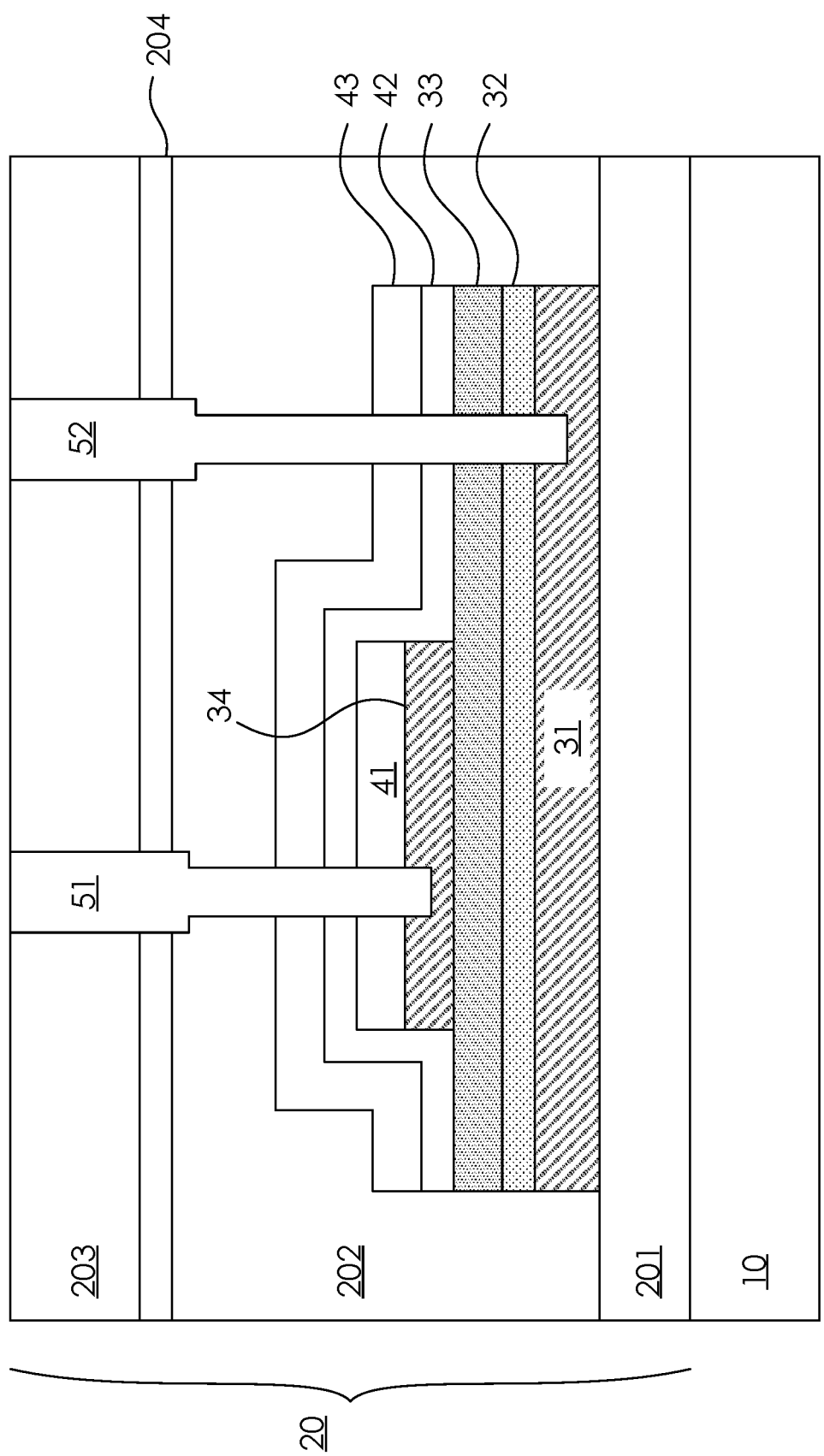
FIG. 1A illustrates a cross-sectional view of a MIM structure according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

In conventional metal insulator metal (MIM) structure, implementing dielectric with greater k value or reducing the thickness of dielectric are usually adopted to enhance the density of capacitance. However, large leakage may be generated in the MIM structure with thinned high dielectric constant (high-k) dielectric due to direct tunneling and small bandgap of high-k dielectric materials. Accordingly, in some embodiments, the single high-k dielectric film in the conventional structure is replaced with a ferroelectric/dielectric heterostructure stack in the present disclosure, and a MIM structure with higher density of capacitance is thus obtained.

FIG. 1A is a cross-sectional view of a MIM structure, in accordance with some embodiments. The MIM structure may include a substrate 10 and a metallization structure 20. The metallization structure 20 is disposed over the substrate 10. The metallization structure 20 includes a bottom electrode layer 31, a dielectric layer 32, a ferroelectric layer 33, a top electrode layer 34, a first contact 51 and a second contact 52. The dielectric layer 32 is disposed on the bottom electrode layer 31, the ferroelectric layer 33 is disposed on the dielectric layer 32, the top electrode layer 34 is disposed on the ferroelectric layer 33, the first contact 51 is electrically coupled to the top electrode layer 34, and the second contact 52 penetrating the dielectric layer 32 and the ferroelectric layer 33, and is electrically coupled to the bottom electrode layer 31.

The substrate 10 can be a silicon (Si) substrate, according to some embodiments. In some other embodiments, the substrate 10 may be some other semiconductor materials such as germanium (Ge), a compound semiconductor such as silicon carbide (SiC), an alloy semiconductor including silicon germanium (SiGe), or combinations thereof. In some embodiments, the substrate 10 may be a semiconductor on insulator (SOI). In some embodiments, the substrate 10 may be an epitaxial material.

The bottom electrode layer 31 may be disposed over the substrate 10. In some embodiments, the bottom electrode layer 31 is formed from an aluminum copper alloy, tantalum nitride (TiN), aluminum (Al), copper (Cu), tungsten (W), metal silicide, other suitable metal or metal alloys, and/or combinations thereof. In some embodiments, the bottom electrode layer 31 may include more than one layer. In some embodiments, the thickness of the bottom electrode layer 31 may in a range of from about 20 nm to about 100 nm.

Between the bottom electrode layer 31 and the top electrode layer 34, a hybrid ferroelectric-dielectric film may be implemented in the MIM structure. In some embodiments, the materials sandwiched by the bottom metal layer 31 and the top metal layer 34 include dielectric and ferroelectric materials. In some embodiments, the thickness of the dielectric layer 32 is in a range of from about 1 nm to about 3 nm, and the dielectric layer 32 is made by $SiO_2$, AlO, LaO, ZrO, TaO, $Al_2O_3$, $HfO_2$, other suitable dielectric material, and/or combinations thereof. Disposed over and in contact with the dielectric layer 32, the thickness of the ferroelectric layer 33 may be in a range of from about 1 nm to about 10 nm if the ferroelectric layer 33 is made by HfO-based material such as HfZrO, HfLaO, HfAlO, HfSiO, HfCrO, etc. In some embodiments, the thickness of the ferroelectric layer 33 may be greater than about 10 nm if the ferroelectric layer 33 is made by PZT, BTO, BST (Barium Strontium Titanate), and/or combinations thereof.

In some embodiments, the total thickness of the stack of the dielectric layer 32 and the ferroelectric layer 33 is in a range of from about 4 nm to about 6 nm, wherein the thickness of the ferroelectric layer 33 may be in a range of from about 3 nm to about 5 nm. Comparing with some conventional MIM structures having a 5 nm thickness high-k dielectric layer, the bilayer/hybrid structure or heterostructure of the present disclosure may provide higher density of capacitance by the polarization coupling effect based on the ferroelectric/dielectric stack whereas the thickness of the MIM structure is substantially maintained. In some embodiments, in addition to one cycle of dielectric layer 32 and the ferroelectric layer 33, multiple cycles can be implemented thereby created a multi-layer dielectric in the MIM structure. When only the ferroelectric layer 33 is presented in the MIM structure (i.e., without the dielectric layer 32), the density of capacitance can also be increased if the k-value of said ferroelectric layer 33 is comparable to those of the high-k dielectrics in the art. Alternatively stated, when the dielectric layer 32/ferroelectric layer 33 stack is presented in the MIM structure, regardless of the k-value of the ferroelectric layer 33, the density of capacitance of the stack can be effectively increased due to polarization coupling effect that present in this unique material combination.

More precisely, the dielectric layer 32 may be made by a high-k dielectric material with a dielectric constant greater than 3.9 to increase the capacitance of the MIM structure. Above the dielectric layer 32, the dielectric constant of the ferroelectric layer 33 is also high, and the dielectric constant of the ferroelectric layer may be higher than the dielectric constant of the dielectric layer in some embodiments. But in some other embodiments, the dielectric constant of the ferroelectric layer 33 may be lower than the dielectric constant of the dielectric layer 32, which means the dielectric constant of the ferroelectric layer 33 itself is not the single variable in enhancing the total capacitance value ($C_{total}$) of the MIM structure. In other words, the present disclosure is to combine the structures of the dielectric layer 32 and the ferroelectric layer 33 to boost the total capacitance value by polarization coupling effect instead of simply adding up the dielectric constants of the dielectric layer 32 and the ferroelectric layer 33. To put it another way, the primary dielectric constant provider in the heterostructure is the dielectric layer 32, whereas the ferroelectric layer 33 thereon is for contributing the polarization coupling effect. Therefore, the total capacitance value ($C_{total}$) may be elevated to a level greater than the capacitance values ($C_{DE}$, $C_{FE}$) of MIM structures which solely using dielectric materials or ferroelectric materials.

Still referring to FIG. 1A, the top electrode layer 34 may be disposed over the ferroelectric layer 33. In some embodiments, the top electrode layer 34 may be formed by using the same material as the bottom electrode layer 31. In some embodiments, the top electrode layer 34 may be formed by using a different material. In some embodiments, the thickness of the top electrode layer 34 may be in a range of from about 20 nm to about 100 nm.

In some embodiments, a plurality of capping layers may be disposed over and cover the top surface of the ferroelectric/dielectric heterostructure. The plurality of capping layers may be used to protect the underlying layers from subsequent fabrication operations. In some embodiments, the plurality of capping layers may be a hard mask layer. For instance, the plurality of capping layers may be a hard mask layer made by silicon nitride ($Si_3N_4$), silicon oxide ($SiO_2$), silicon oxynitride ($SiO_xN_y$), other suitable materials, and/or combinations thereof. In some embodiments, such protection structure is formed by using a single layer. In some embodiments, such protection structure is formed by using two or more layers. For instance, the plurality of capping layers may include a first capping layer 41, a second capping layer 42, and a third capping layer 43 as shown in FIG. 1A, wherein the first capping layer 41 is disposed over the top electrode layer 34, the second capping layer 42 is disposed over the first capping layer 41 and the ferroelectric layer 33, and the third capping layer 43 is disposed over the second capping layer 42.

In some embodiments, the metallization structure 20 includes a first inter-metal dielectric (IMD) layer 201, a second IMD layer 202, a third IMD layer 203, and a hard mask layer 204. The bottom electrode layer 31 is formed on the first IMD layer 201, and the MIM structure is laterally surrounded by the second IMD layer 202. In some embodiments, the first IMD layer 201 may be an oxide layer disposed to provide isolation between the bottom electrode layer 31 and substrate 10. The first IMD layer 201 may act as a buffer layer for a subsequent metal deposition to reduce hillock defects. In some embodiments, the first IMD layer 201 may be deposited by plasma enhanced chemical vapor deposition (PECVD), and the thickness of the first IMD layer 201 may in a range of from about 20 to about 100 nm. In some embodiments, the first IMD layer 201 may not be needed if hillock defects can be removed.

The second IMD layer 202 and the third IMD layer 203 may each be an insulating layer used to provide electrical insulation between the interconnect lines. The second IMD layer 202 may be formed over the bottom electrode layer 31, the dielectric layer 32, the ferroelectric layer 33, the top electrode layer 34, the first capping layer 41, the second capping layer 42, and the third capping layer 43. In some embodiments, the second IMD layer 202 may be formed of silicon oxide, undoped silica glass (USG), fluorinated silica glass (FSG), a low-k dielectric material (e.g., material with a dielectric constant less than about 3.9), an extremely low-k dielectric material (e.g., material with a dielectric constant less than about 2.5), other suitable materials, and/or combinations thereof. In some embodiments, the thicknesses of the second IMD layer 202 and the third IMD layer 203 may be in a range of from about 500 nm to about 1000 nm. In some embodiments, the hard mask layer 204 may be disposed over the second IMD layer 202 for electrodes interconnect patterning. The hard mask layer 204 may be formed of silicon oxynitride ($SiO_xN_y$), silicon oxide ($SiO_2$), silicon nitride ($Si_3N_4$), other suitable materials, and/or combinations thereof.

Still referring to FIG. 1A, in some embodiments, the first contact 51 may be used to provide an electrical connection to the top electrode layer 34 and may also be used as a metal interconnect for electrically connecting of the MIM structure to external devices or peripheral circuits. The first contact 51 may be formed in the second IMD layer 202 and the third IMD layer 203. The first contact 51 may extend into the top electrode layer 34 to ensure a reliable low resistance electrical contact. In some embodiments, the extension in the z-direction may be greater than about 20 nm to ensure reliable low resistance electrical contact between metals of the first contact 51 and the top electrode layer 34. The first contact 51 may be made by copper (Cu), tungsten (W), aluminum (Al), other suitable metals, and/or combinations thereof.

In some embodiments, the contact 52 may be used to provide the electrical connection to the bottom electrode layer 31 and may also be used as a metal interconnect for electrically connecting of the MIM structure to external devices or peripheral circuits. The contact 52 may be formed in the second IMD layer 202 and the third IMD layer 203. The contact 52 may extend into the bottom electrode layer 31 to ensure a reliable low resistance electrical contact. In some embodiments, the extension in the z-direction may be greater than about 20 nm for reliable low resistance electrical contact between the contact 52 and the bottom electrode layer 31. The contact 52 may be made by a material similar to the first contact 51.

Figure 1B:
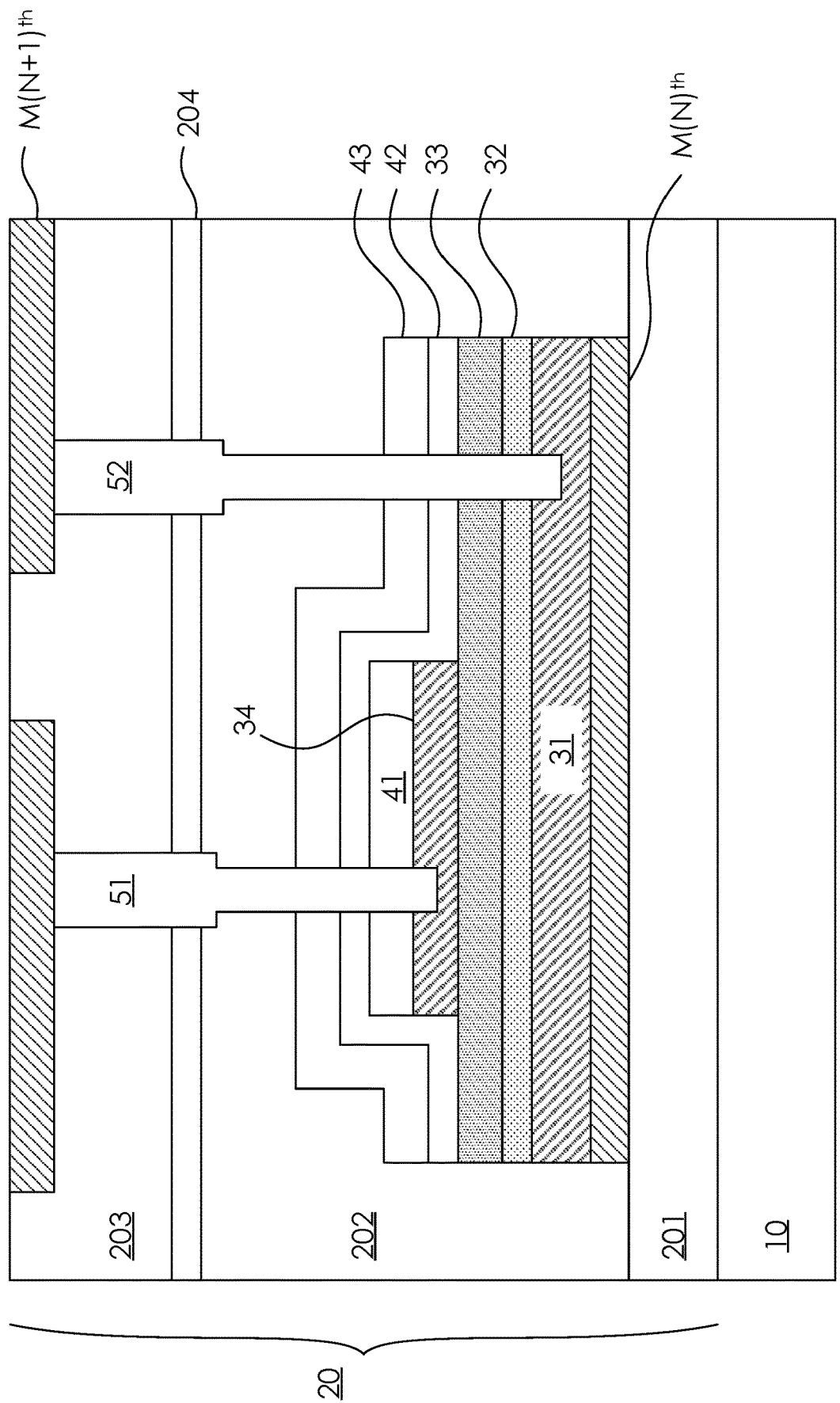
FIG. 1B illustrates a cross-sectional view of a MIM structure according to some embodiments of the present disclosure.

Referring to FIG. 1B, in some embodiments, the MIM structure may be formed between an $N^{th}$ metal layer $M(N)^{th}$ and an $(N+1)^{th}$ metal layer $M(N+1)^{th}$. In such embodiments, the a bottom electrode layer 31 may be formed over the $N^{th}$ metal layer, and the $(N+1)^{th}$ metal layer may be formed over the top electrode layer 34. In some embodiments, N may be integer greater than or equal to 1. For example, the MIM structure is situated between the $4^{th}$ metal layer and the $5^{th}$ metal layer.

Figure 2:
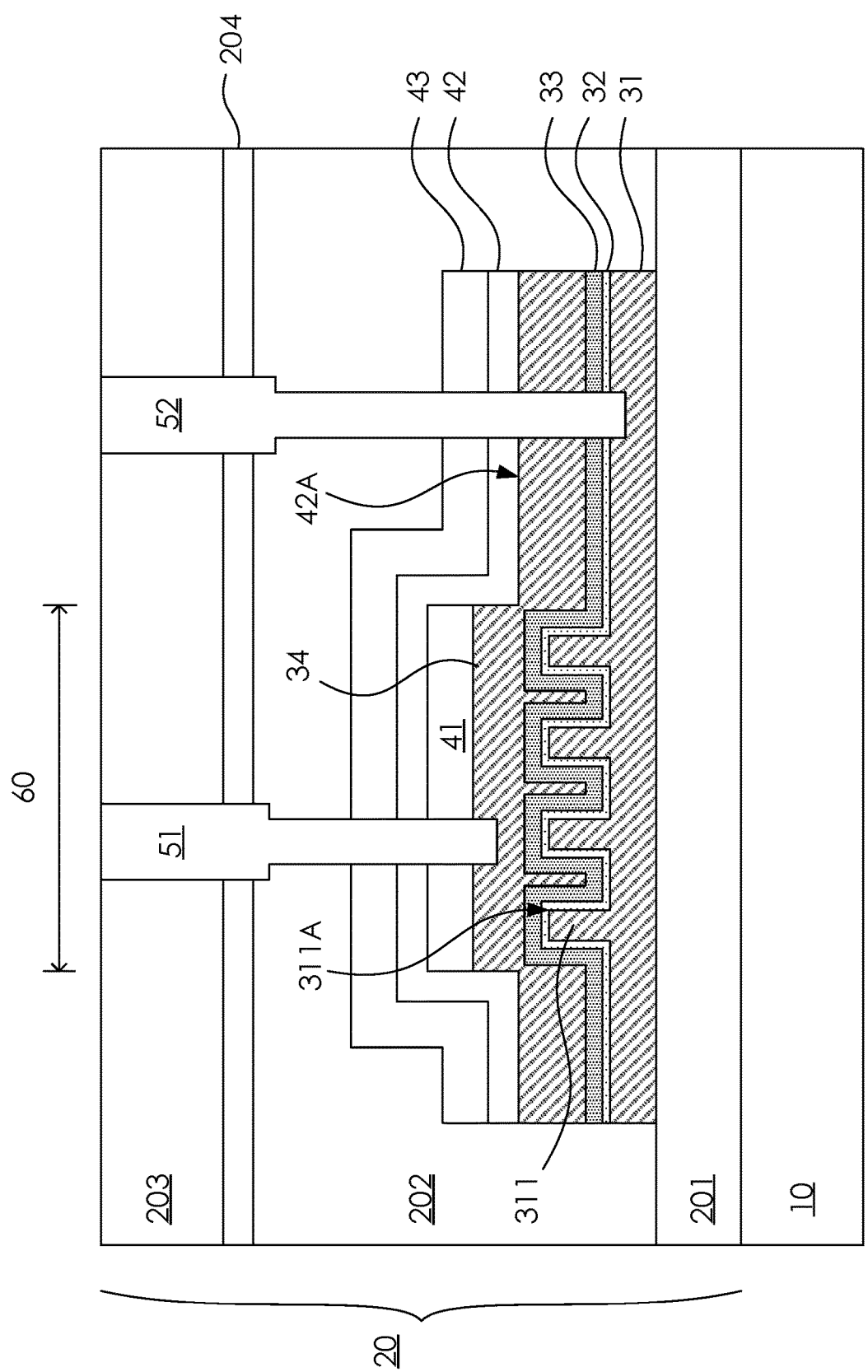
FIG. 2 illustrates a cross-sectional view of a MIM structure according to some embodiments of the present disclosure.

FIG. 2 is a cross-sectional view of a 3D MIM structure in accordance with some embodiments. In such embodiments, the bottom electrode layer 31 may include a plurality of first protrusions 311 in contact with the dielectric layer 32. The first protrusions 311 may be a plurality of metal mandrels in some embodiments.

In some embodiments, a top surface 311A of each of the plurality of first protrusions 311 is lower than a bottom surface 42A of the second capping layer 42. In some embodiments, the first protrusions 311 are laterally surrounded by the stack of the dielectric layer 32 and the ferroelectric layer 33. In some embodiments, all of the first protrusions 311 are formed in an active area 60 of the 3D MIM structure and covered by the first capping layer 41, whereas in some embodiments, some of the first protrusions 311 may be more widely formed and not be covered by the first capping layer 41.

In some embodiments, the height of the first protrusions 311 may in a range of from about 10 nm to about 300 nm. The upper limit of the height may prevent the decrease of the structure uniformity and the capacitance uniformity caused by collapse, whereas the lower limit of the height may ensure the total capacitance may be further increased in such 3D MIM structure.

In some embodiments, the width of each of the first protrusions 311 may in a range of from about 1 nm to about 30 nm. The upper limit of the height may prevent the decrease of the structure uniformity and the capacitance uniformity caused by collapse, whereas the lower limit of the height may ensure the total capacitance may be further increased in such 3D MIM structure.

In some embodiments, the aspect ratio of the height to the width of the first protrusions 311 may in a range of from about 1 to about 30. The upper limit of the aspect ratio may prevent the decrease of the structure uniformity and the capacitance uniformity caused by collapse, whereas the lower limit of the aspect ratio may ensure the total capacitance may be further increased in such 3D MIM structure.

The dimensions and aspect ratios of the first protrusions 311 may improve the structure uniformity and the capacitance uniformity, and the surface area of the bottom electrode layer 31, the dielectric layer 32 and the ferroelectric layer 33 may be increased, thereby the total capacitance of such 3D MIM structure is also increased.

Figure 3:
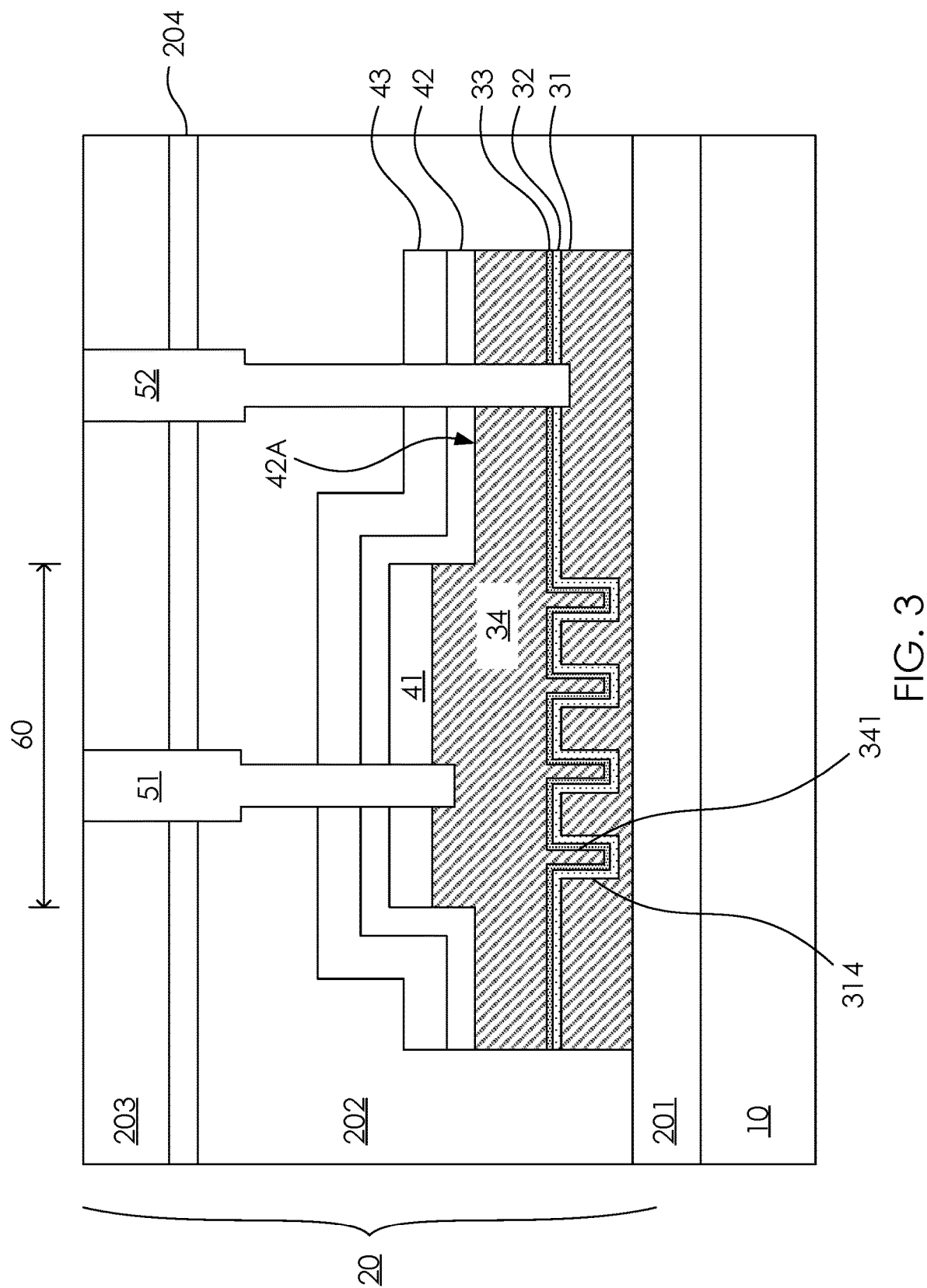
FIG. 3 illustrates a cross-sectional view of a MIM structure according to some embodiments of the present disclosure.

FIG. 3 is a cross-sectional view of a 3D MIM structure in accordance with some embodiments. In such embodiments, the bottom electrode layer 31 may include a plurality of trenches 314, and each of the trenches 314 has a U-shape extending toward the substrate 10. Moreover, the stack of the dielectric layer 32 and the ferroelectric layer 33 over the bottom electrode layer 31 is also has a U-shape extending toward the substrate 10. In other words, the first IMD layer 201 in such embodiments includes a plurality of trenches 314 to contain the bottom electrode layer 31, the dielectric layer 32 and the ferroelectric layer 33. In such embodiments, the top electrode layer 34 may include a plurality of second protrusions 341 extended into the plurality of trenches 314 of the bottom electrode layer 31.

Figure 4A:
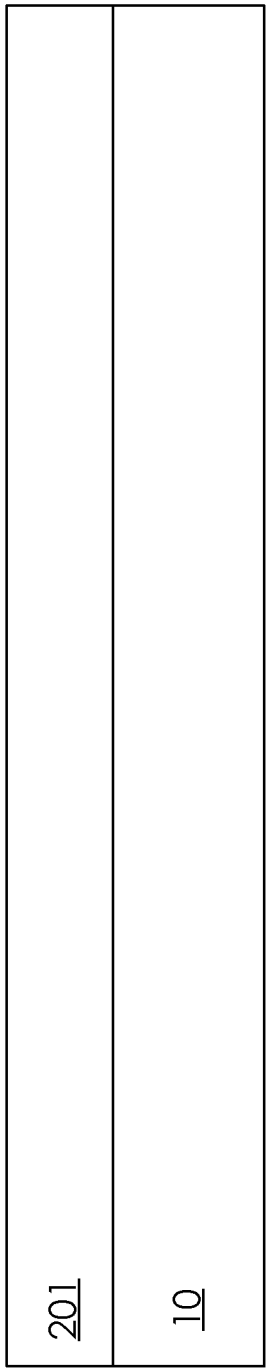

FIGS. 4A to 4I disclose a method for fabricating a MIM structure in accordance with some embodiments. As shown in FIG. 4A, the substrate 10 may be firstly provided, and the first IMD layer 201 may be disposed over the substrate 10. As aforementioned, the substrate 10 may be made by silicon. In some embodiments, the substrate 10 may be SiC deposited by chemical vapor deposition (CVD) as a back end of line (BEOL) via etch stop. In some embodiments, the thickness of deposited SiC may be in a range of from about 10 nm to about 50 nm. In some embodiments, the first IMD layer 201 may be deposited by PEVCD over the substrate 10, and the thickness of the first IMD layer 201 may be in a range of from about 20 nm to about 100 nm.

Figure 4B:
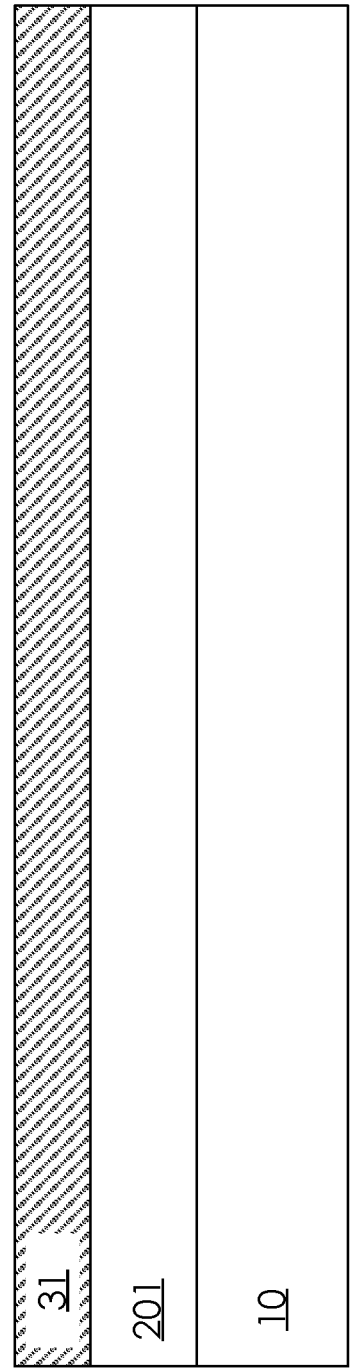

As shown in FIG. 4B, the bottom electrode layer 31 may deposited over the first IMD layer 201. The deposition of the bottom electrode layer 31 may be done by physical vapor deposition (PVD). In some embodiments, other suitable operations may be used to form the bottom electrode layer 31, such as atomic layer deposition (ALD), molecular beam epitaxy (MBE), high density plasma CVD (HDPCVD), metal organic (MOCVD), remote plasma CVD (RPCVD), PECVD, plating, other suitable methods, and/or combinations thereof. In some embodiments, the bottom electrode layer 31 may be a TiN layer with a thickness of about 50 nm.

Figure 4C:
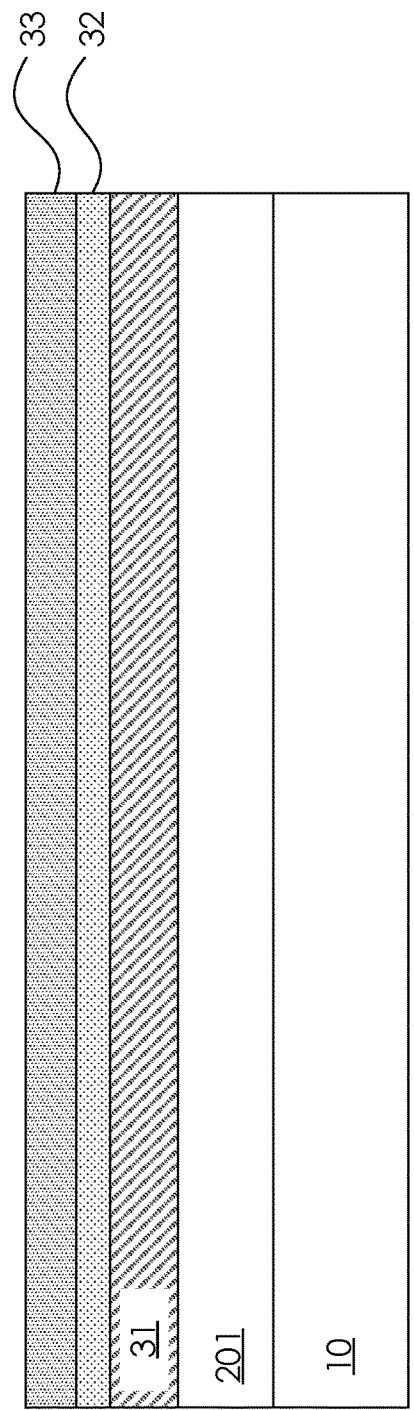

As shown in FIG. 4C, the dielectric layer 32 and the ferroelectric layer 33 may be formed over the bottom electrode layer 31 sequentially. The dielectric layer 32 is made by a high-k material. In some embodiments, the dielectric layer 32 may have a dielectric constant greater than 3.9 depending on the type of material. In some embodiments, the dielectric layer 32 may be a thin film deposited with an ALD operation with a thickness in a range of from about 1 nm to about 3 nm. In some embodiments, the dielectric layer 32 may include a plurality of sublayers including different dielectric materials such as $SiO_2$, AlO, LaO, ZrO, TaO, $Al_2O_3$, and $HfO_2$. In some embodiments, the ferroelectric layer 33 over the dielectric layer 32 may also be a thin film deposited with an ALD operation with a thickness in a range of from about 1 nm to about 10 nm if the material of the ferroelectric layer 33 is HfO-based material such as HfZrO, HfLaO, HfAlO, HfSiO, HfCrO, etc. In some embodiments, the thickness of the ferroelectric layer 33 may be greater than about 10 nm if the ferroelectric layer 33 is made by PZT, BTO, BST (Barium Strontium Titanate), and/or combinations thereof. In some embodiments, the ferroelectric layer 33 may be formed by an in-situ doping operation.

Figure 4D:
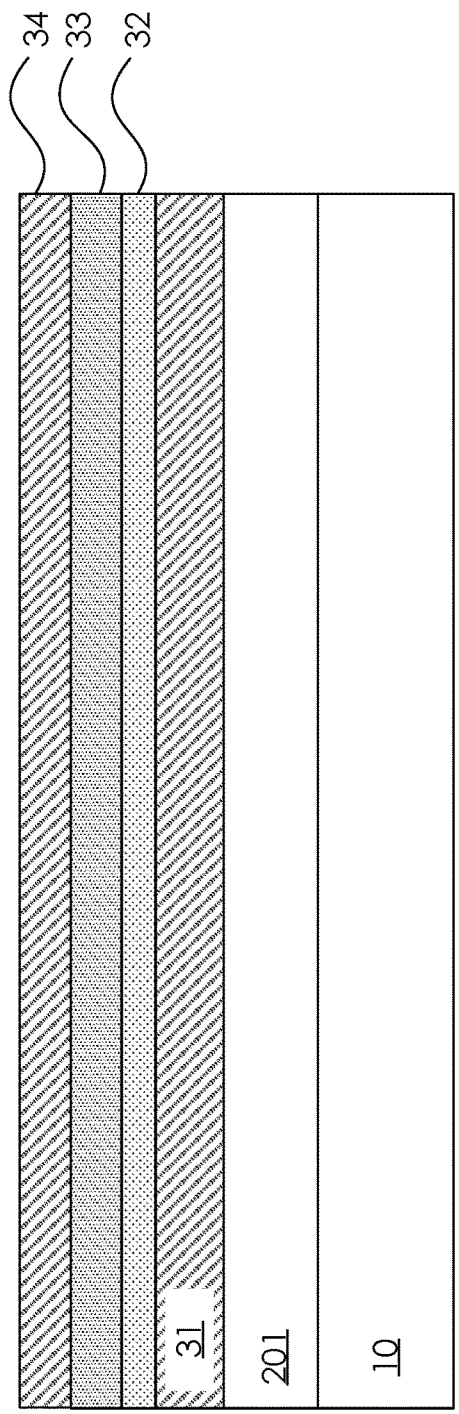

As shown in FIG. 4D, after the stack of the dielectric layer 32 and the ferroelectric layer 33 is formed over the bottom electrode layer 31, the top electrode layer 34 may be formed over the ferroelectric layer 33. In some embodiments, the top electrode layer 34 may be deposited by using the same deposition method and as the bottom electrode layer 31. In some embodiments, the top electrode layer 34 may be made by the same material as the bottom electrode layer 31. In some embodiments, the thickness of the top electrode layer 34 may be in a range of from about 20 nm to about 100 nm. In some embodiments, the top electrode layer 34 may be a TiN layer with a thickness of about 50 nm.

As shown in FIG. 4E, the first capping layer 41 may be deposited over the top electrode layer 34. In some embodiments, the first capping layer 41 may be formed by any suitable processes, such as PVD, ALD, CVD, other suitable methods, and/or combinations thereof. In some embodiments, the first capping layer 41 may be a hard mask formed by silicon oxynitride ($SiO_xN_y$) deposited by ALD. In some embodiments, the thickness of the first capping layer 41 may be in a range of from about 10 nm to about 50 nm.

Referring to FIG. 4F, in some embodiments, the first capping layer 41 and the top electrode layer 34 may be patterned to define the top electrode of the MIM structure. In some embodiments, a masking layer (not shown) may be formed over the first capping layer 41 and patterned to protect regions of the first capping layer 41 and the top electrode layer 34. Composition of the masking layer may include a photoresist, a hard mask, and/or other suitable materials. The patterning operation may include forming the masking layer over the first capping layer 41, exposing the resist to a pattern, performing post-exposure bake processes, and developing the resist to form a masking element including the photoresist. The masking element may be used to protect regions of the first capping layer 41 while one or more etching operations sequentially removes exposed underlying over the first capping layer 41 and the top electrode layer 34. In some embodiments, the ferroelectric layer 33 may act as an etch stop layer during the patterning of the top electrode layer 34.

Figure 4G:
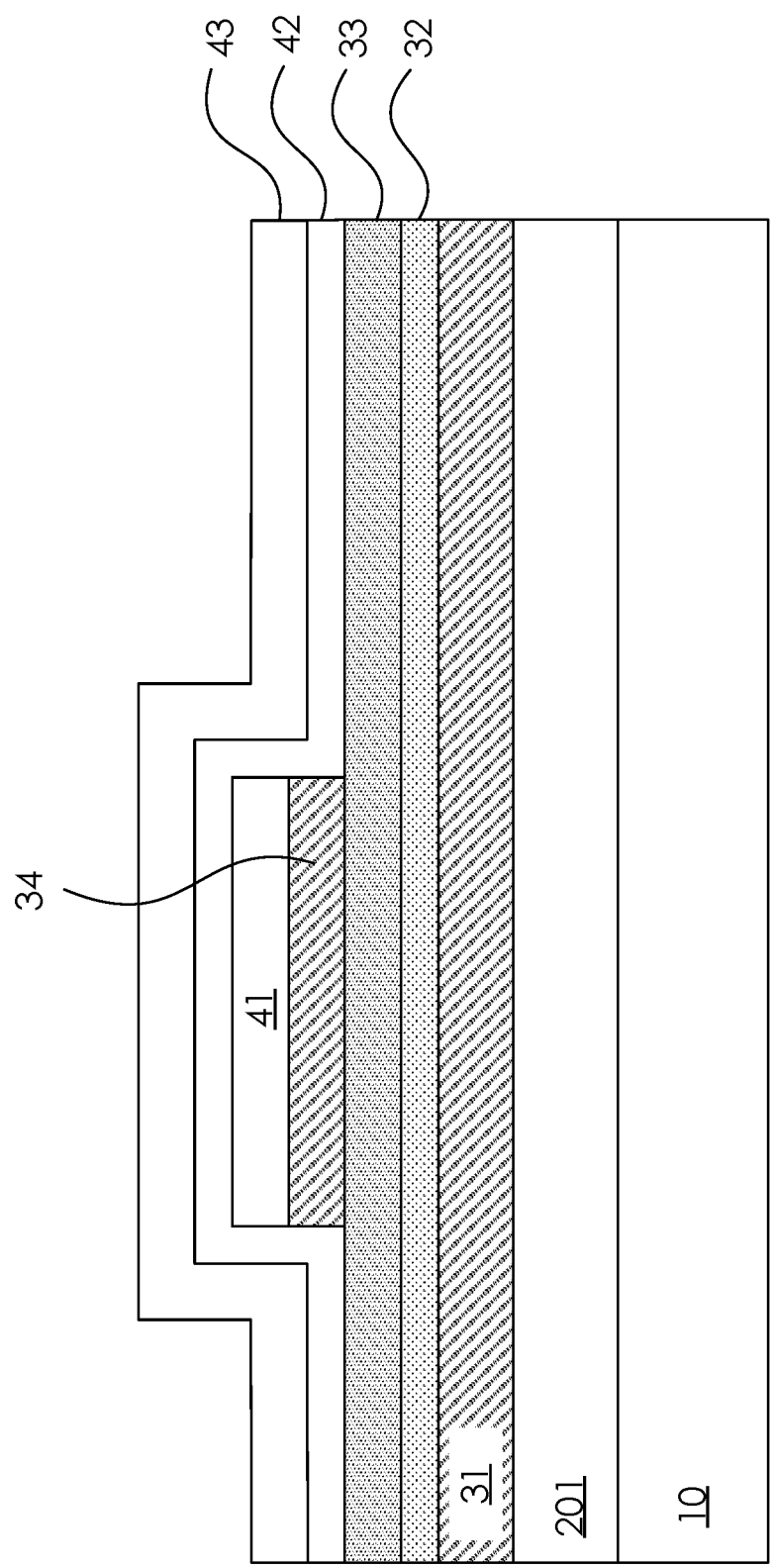
Figure 4H:
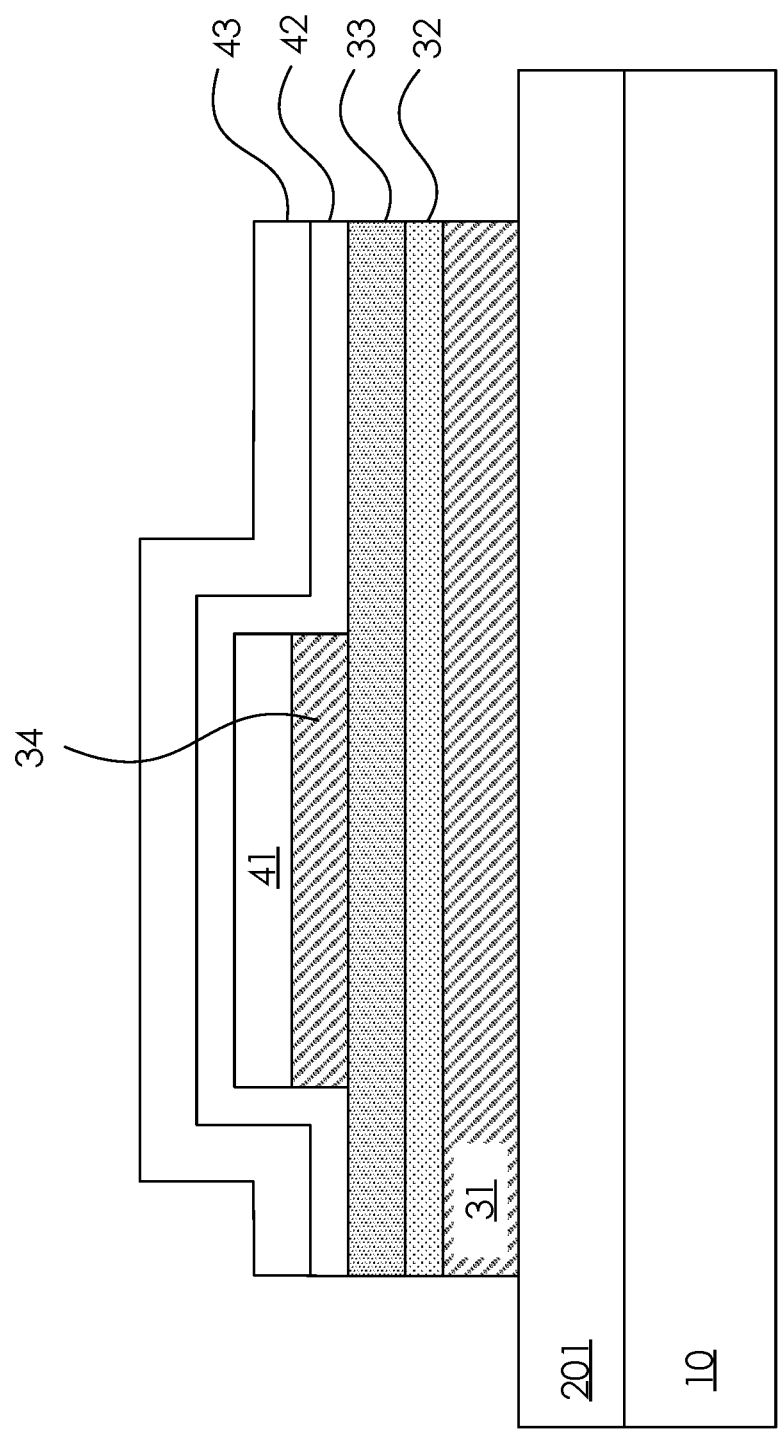

Referring to FIG. 4G, the second capping layer 42 may be formed over the first capping layer 41 and the exposed ferroelectric layer 33, and the third capping layer 43 may be formed over the second capping layer 42 sequentially. In some embodiments, the second capping layer 42 may be a silicon oxide hard mask deposited by PVD or ALD. In some embodiments, the thickness of the second capping layer 42 may in a range of from about 20 nm to about 100 nm. In some embodiments, the third capping layer 43 may be a silicon nitride hard mask deposited by ALD or CVD. In some embodiments, the thickness of the third capping layer 43 may in a range of from about 10 nm and about 50 nm.

Figure 4I:
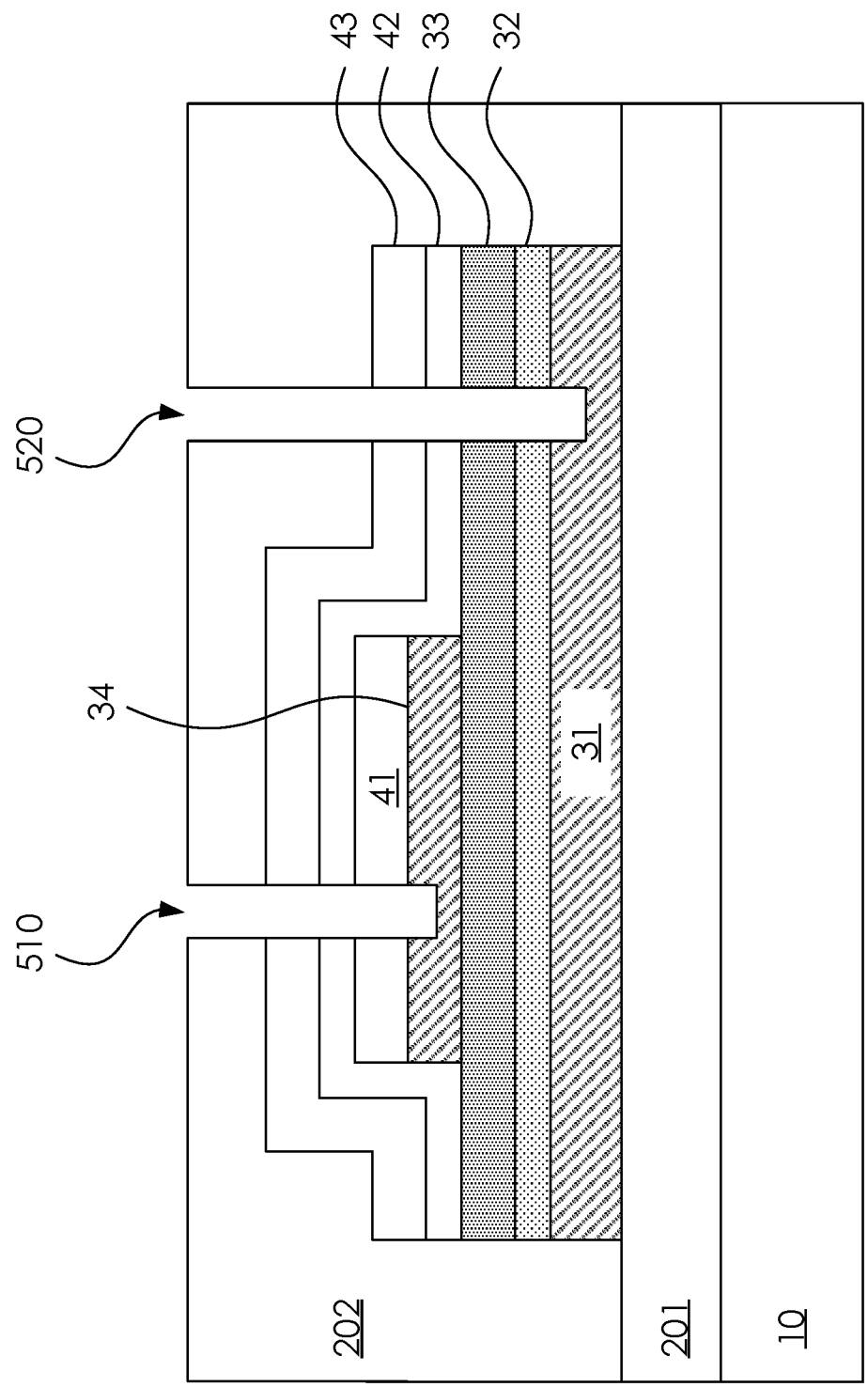

As shown in FIG. 4I1, in some embodiments, an active area of the MIM structure may be patterned and a portion of the non-active area may be etched off. The active area of the MIM structure may be defined where the top electrode layer 34 overlaps the bottom electrode layer 31, for instance, the area under the top electrode layer 34. The active area would be the area to calculate the capacitance of the MIM structure. In some embodiments, the portion of the non-active area may be etched off by $Cl_2$-based dry etching.

Referring to FIG. 4I, in some embodiments, the second IMD layer 202 may be formed over the third capping layer 43 and the first IMD layer 201. In some embodiments, a first opening 510 and a second opening 520 may be formed in the first capping layer 41, the second capping layer 42, the third capping layer 43, and the second IMD layer 202 prior to forming the first contact 51 and the second contact 52 as previously shown in FIG. 1A.

Figure 5A:
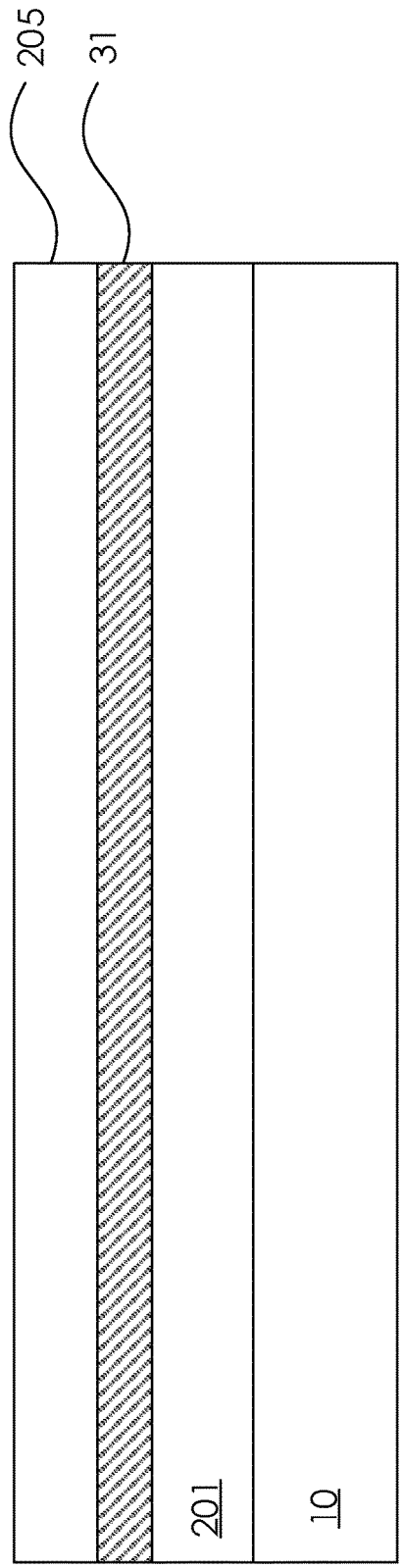

In the method for manufacturing the 3D MIM structure in accordance with some embodiments, the operations may be different after the bottom electrode layer 31 is formed over the first IMD layer 201 as previous shown in FIG. 4B. As shown in FIG. 5A, in some embodiments, a hard mask layer 205 may be deposited over the bottom electrode layer 31. The hard mask layer 205 may be formed by silicon oxynitride ($SiO_xN_y$), silicon oxide ($SiO_2$), silicon nitride ($Si_3N_4$), other suitable materials, and/or combinations thereof. In some embodiments, the hard mask layer 205 may be deposited by CVD, ALD, PVD, other suitable methods, and/or combinations thereof. For instance, the hard mask layer 205 may be a silicon nitride layer deposited by ALD. In some embodiments, the thickness of the hard mask layer 205 may be in a range of from about 10 nm to about 50 nm.

Figure 5B:
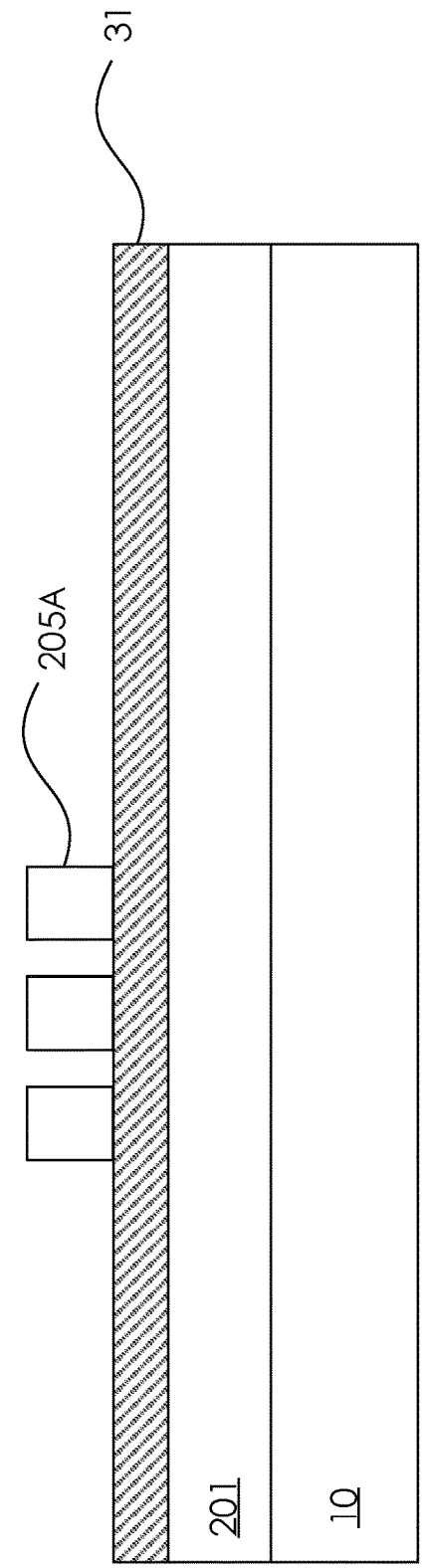

As shown in FIGS. 5A and 5B, the photolithography and etching operations may be processed on the hard mask layer 205 to form a plurality of mandrel patterns 205A. In some embodiments, a masking layer (not shown) may be formed over the hard mask layer 205 and patterned to protect regions of the plurality of mandrel patterns 205A during the etching operation. The composition of the masking layer may include a photoresist, a hard mask, and/or other suitable materials. The patterning operation may include forming the masking layer over the hard mask layer 205, exposing the resist to a pattern, performing post-exposure bake processes, and developing the resist to form a masking element including the photoresist. The masking element can be used to protect regions of the hard mask layer 205 while one or more etching operations sequentially removes exposed the hard mask layer 205. In some embodiments, the bottom electrode layer 31 may act as an etch stop layer for etching the hard mask layer 205. After etching, the mandrel patterns 205A may be patterned on the bottom electrode layer 31, and the bottom electrode layer 31 may be exposed where there are no mandrel patterns 205A.

Figure 5C:
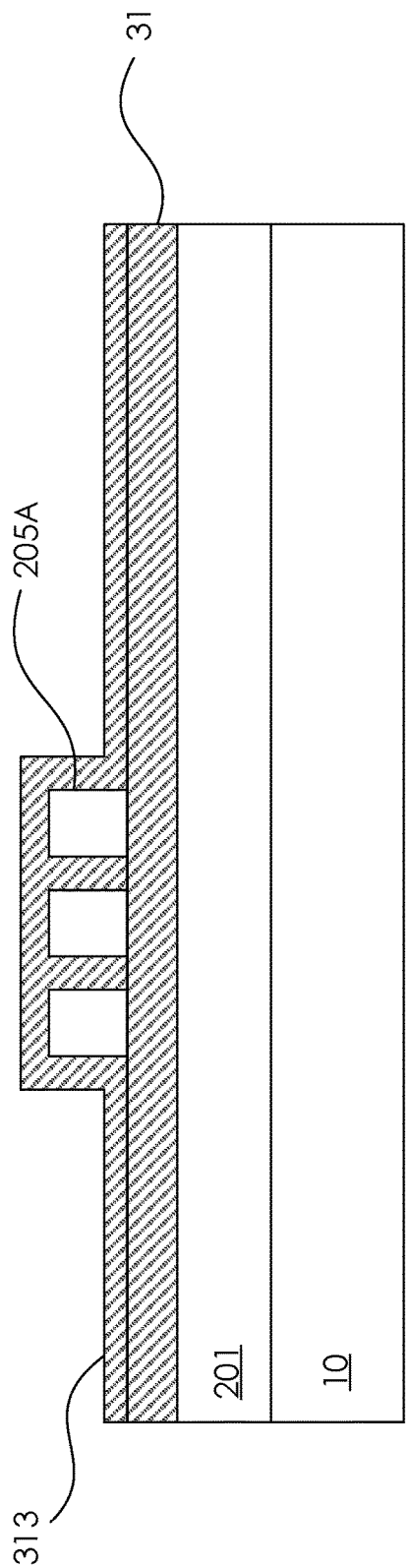

As shown in FIG. 5C, an electrode layer 313 may be formed and covers the mandrel patterns 205A and the bottom electrode layer 31. The electrode layer 313 may be deposited by ALD. The electrode layer 313 may be deposited using the same material as the bottom electrode layer 31. For instance, the electrode layer 313 may be ALD deposited TiN with better layer uniformity around the mandrel patterns 205A. In some embodiments, the thickness of the electrode layer 313 may in a range of from about 1 nm to about 30 nm.

Figure 5D:
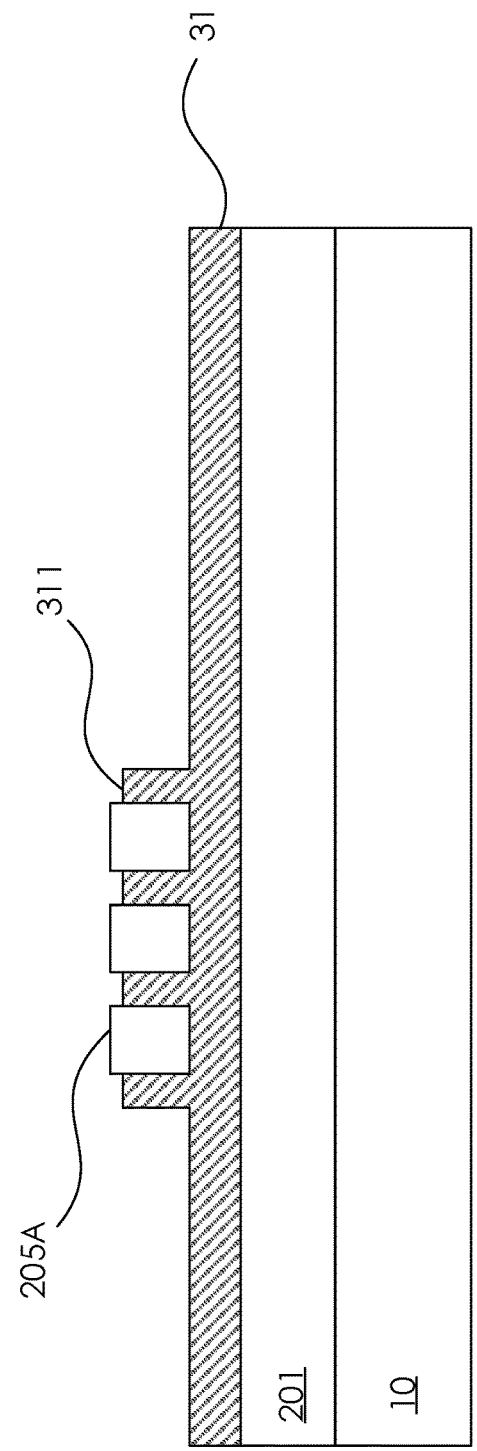

In some embodiments, after the electrode layer 313 is deposited on the mandrel patterns 205A and the bottom electrode layer 31, the electrode layer 313 may be etched back as shown in FIG. 5D. The electrode layer 313 may be etched by a chlorine based wet etching operation, for example, a mix of hydrochloric acid (HCl) and ammonia. In some embodiments, the electrode layer 313 may also be etched by a chlorine or bromine based etching operation, such as a reactive ion etch (RIE) with chlorine or bromine based ions. After etching, the electrode layer 313 is removed from the surface of the bottom electrode layer 31 and the top surfaces and a portion of side surfaces of the mandrel patterns 205A, thereby the mandrel patterns 205A are exposed. The electrode material remained over the original bottom electrode layer 31 may be act as the first protrusions 311 as previously shown in FIG. 2. Moreover, the mandrel patterns 205A may be removed by a wet etching operation as shown in FIG. 5E, according to some embodiments. The wet etching operation can be phosphoric acid ($H_3PO_4$) based operation, which may remove the mandrel patterns 205A and keep and the bottom electrode layer 31 and the first protrusions 311.

As shown in FIG. 5F, the dielectric layer 32 and the ferroelectric layer 33 may be formed sequentially over the bottom electrode layer 31 and the first protrusions 311. The stack of the dielectric layer 32 and the ferroelectric layer 33 may be formed along the shape of the first protrusions 311, thereby the first protrusions 311 are laterally surrounded by the stack of the dielectric layer 32 and the ferroelectric layer 33. The follow up operations in forming the top electrode layer 34, the capping layers, the second IMD layer 202, and the contacts 51 and 52 may refer to FIGS. 4D to 4I and omitted here for brevity.

As shown in FIG. 6A, in some other embodiments, the photolithography and etching operations may also be processed on the hard mask layer 205 to form the plurality of mandrel patterns 205A, wherein the mandrel patterns 205A are used as a hard mask in patterning the bottom electrode layer 31 therebelow. As shown in FIG. 6B, a plurality of trenches 314 may be formed at the bottom electrode layer 31, and the sidewalls of the mandrel patterns 205A are aligned with the sidewalls of the trenches 314. In some embodiments, the bottom electrode layer 31 may be etched by a chlorine based wet etching operation similar with the operation disclosed in the previous shown FIG. 5D. After the trenches 314 are formed by etching, the mandrel patterns 205A may be removed by a wet etching operation as shown in FIG. 6C, according to some embodiments. The wet etching operation may be phosphoric acid ($H_3PO_4$) based operation, which may remove the mandrel patterns 205A and keep and the bottom electrode layer 31 and the trenches 314.

As shown in FIG. 6D, the dielectric layer 32 and the ferroelectric layer 33 may be formed sequentially over the bottom electrode layer 31 and in the trenches 314. The stack of the dielectric layer 32 and the ferroelectric layer 33 may be formed along the shape of the trenches 314, thereby the stack structure and the top electrode layer 34 (as previously shown in FIG. 3) may be extended into the plurality of trenches 314. The follow up operations in forming the top electrode layer 34, the capping layers, the second IMD layer 202, and the contacts 51 and 52 may refer to FIGS. 4D to 4I and omitted here for brevity.

According to the present disclosure, the capacitor with MIM structure includes a ferroelectric/dielectric heterostructure stack between the top and bottom electrode layers instead of a single high-k dielectric film therebetween is disclosed. The ferroelectric/dielectric heterostructure may enhance the dielectric constant provided by the dielectric layer and the total capacitance value ($C_{total}$) may be elevated to a level greater than the capacitance values ($C_{DE}$, $C_{FE}$) of MIM structures which solely using dielectric or ferroelectric materials. By depositing the ferroelectric layer on the dielectric layer, the polarization coupling effect may be realized and the issue of leakage caused by direct tunneling or small bandgap of high-k dielectric materials may be substantially neglected.

In one exemplary aspect, a MIM structure is provided. The MIM structure includes a substrate and a metallization structure. The metallization structure is disposed over the substrate. The metallization structure includes a bottom electrode layer, a dielectric layer, a ferroelectric layer, a top electrode layer, a first contact, and a second contact. The dielectric layer is on the bottom electrode layer. The ferroelectric layer is on the dielectric layer. The top electrode layer is on the ferroelectric layer. The first contact is electrically coupled to the top electrode layer. The second contact penetrates the dielectric layer and the ferroelectric layer, and is electrically coupled to the bottom electrode layer.

In another exemplary aspect, a capacitor structure is provided. The capacitor structure includes an $N^{th}$ metal layer, a bottom electrode layer, at least a stack structure, a top electrode layer, and an $(N+1)^{th}$ metal layer. The bottom electrode layer is disposed over the $N^{th}$ metal layer. The stack structure is on the bottom electrode layer. Each of the stack structure includes a dielectric layer and a ferroelectric layer on the dielectric layer. The top electrode layer is disposed on the stack structure. The $(N+1)^{th}$ metal layer is disposed over the top electrode layer.

In yet another exemplary aspect, a method for manufacturing a MIM structure is provided. The method includes the following operations. A substrate is provided. A bottom electrode layer is formed over the substrate. A dielectric layer is formed on the bottom electrode layer. A ferroelectric layer is formed on the dielectric layer. A top electrode layer is formed on the ferroelectric layer. A first contact is formed and electrically coupled to the top electrode. A second contact is formed and electrically coupled to the bottom electrode layer. The second contact penetrates the dielectric layer and the ferroelectric layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A metal insulator metal (MIM) structure, comprising:
a substrate; and
a metallization structure over the substrate, comprising:
a bottom electrode layer;
a dielectric layer on the bottom electrode layer;
a ferroelectric layer on the dielectric layer, wherein the ferroelectric layer is substantially made of lead zirconate titanate (PZT), $BaTiO_3$ (BTO), or barium strontium titanate (BST), and a thickness of the ferroelectric layer is greater than a thickness of the dielectric layer;
a top electrode layer on the ferroelectric layer;
a first contact electrically coupled to the top electrode layer; and a second contact penetrating the dielectric layer and the ferroelectric layer, electrically coupled to the bottom electrode layer.

2. The MIM structure of claim 1, wherein a dielectric constant of the ferroelectric layer is higher than a dielectric constant of the dielectric layer.

3. The MIM structure of claim 1, wherein a thickness of the dielectric layer is in a range of from about 1 nm to about 3 nm.

4. The MIM structure of claim 1, further comprising:
a first capping layer over the top electrode layer;
a second capping layer over the first capping layer and the ferroelectric layer; and
a third capping layer over the second capping layer.

5. The MIM structure of claim 4, wherein the bottom electrode layer comprises:
a plurality of first protrusions in contact with the dielectric layer.

6. The MIM structure of claim 5, wherein a top surface of each of the plurality of first protrusions is lower than a bottom surface of the second capping layer.

7. The MIM structure of claim 5, wherein the bottom electrode layer comprises:
a plurality of trenches each has a U-shape extending toward the substrate.

8. The MIM structure of claim 7, wherein the top electrode layer comprises a plurality of second protrusions extending into the plurality of trenches, and the plurality of second protrusions are laterally surrounded by an inter-metal dielectric (IMD) layer.

9. The MIM structure of claim 5, wherein a number of the plurality of first protrusions are free from covered by the first capping layer.

10. A capacitor structure, comprising:
an $N^{th}$ metal layer;
a bottom electrode layer over the $N^{th}$ metal layer;
at least a stack structure on the bottom electrode layer, each of the stack structures comprising:
a dielectric layer; and
a ferroelectric layer on the dielectric layer, wherein the ferroelectric layer is substantially made of lead zirconate titanate (PZT), $BaTiO_3$ (BTO), or barium strontium titanate (BST), and a thickness of the ferroelectric layer is greater than a thickness of the dielectric layer;
a top electrode layer on the stack structure; and
an (N+1)th metal layer over the top electrode layer.

11. The capacitor structure of claim 10, wherein the bottom electrode layer has a plurality of first protrusions.

12. The capacitor structure of claim 11, wherein the plurality of first protrusions are laterally surrounded by the stack structure.

13. The capacitor structure of claim 10, wherein the bottom electrode layer has a plurality of trenches each comprising a U-shape extending toward the substrate.

14. The capacitor structure of claim 13, wherein the top electrode layer has a plurality of second protrusions extending into the plurality of trenches.

15. The capacitor structure of claim 14, wherein the stack structure is extended into the plurality of trenches and laterally surrounds the second protrusions.

16. The capacitor structure of claim 10, wherein a thickness of the ferroelectric layer over the dielectric layer is greater than about 10 nm.

17. A method for manufacturing a metal insulator metal (MIM) structure, the method comprising:
providing a substrate;
forming a bottom electrode layer over the substrate;
forming a dielectric layer on the bottom electrode layer;
forming a ferroelectric layer on the dielectric layer;
forming a top electrode layer on the ferroelectric layer; and
forming a first contact electrically coupled to the top electrode and a second contact electrically coupled to the bottom electrode layer, wherein the second contact penetrates the dielectric layer and the ferroelectric layer;
wherein forming the ferroelectric layer comprises performing an in-situ doping operation.

18. The method of claim 17, further comprising:
forming a plurality of mandrel patterns on a top surface of the bottom electrode layer;
forming an electrode layer covers the mandrel patterns and the bottom electrode layer;
removing the electrode layer from a top surface of the mandrel patterns and thereby exposing the mandrel patterns; and
removing the mandrel patterns.

19. The method of claim 17, further comprising:
forming a first inter-metal dielectric (IMD) layer over the substrate; and
forming a plurality of trenches at a top surface to the first IMD layer.

20. The method of claim 17, further comprising:
forming a first capping layer over the top electrode layer;
forming a second capping layer over the first capping layer and the ferroelectric layer;
forming a third capping layer over the second capping layer;
forming a second IMD layer over the third capping layer and the first IMD layer; and
forming an opening in the first capping layer, the second capping layer, the third capping layer, and the second IMD layer prior to forming the first contact.

* * * * *